United States Patent [19]

Matsui et al.

[11] 4,414,604

[45] Nov. 8, 1983

[54] HEAT RADIATION SYSTEM FOR ELECTRONIC DEVICES

[75] Inventors: Fumio Matsui; Yutaka Takasu, both of Saitama, Japan

[73] Assignee: Pioneer Electronic Corporation, Tokyo, Japan

[21] Appl. No.: 364,708

[22] Filed: Apr. 2, 1982

Related U.S. Application Data

[63] Continuation of Ser. No. 97,110, Nov. 20, 1979, abandoned.

[30] Foreign Application Priority Data

Nov. 22, 1978 [JP] Japan .................. 53-144774

[51] Int. Cl.³ .................................... H05K 7/20
[52] U.S. Cl. ...................... 361/385; 165/104.11; 174/15 HP
[58] Field of Search .................. 361/381–383, 361/385, 386; 174/16 HS, 15 HP; 165/105, 80 C, 80 E

[56] References Cited

U.S. PATENT DOCUMENTS 3,035,419 5/1962 Wigert .
3,651,865 3/1972 Feldmanis .
4,120,019 10/1978 Arii .
4,237,866 12/1980 Rush .

FOREIGN PATENT DOCUMENTS 1284500 12/1968 Fed. Rep. of Germany ...... 361/385
52-16101 7/1975 Japan .................................... 361/385

OTHER PUBLICATIONS

"New Local Cooling—Heat Pipe", Iwata, IEEE Transactions on Power Systems, vol. PAS-99, No. 3, May/Jun. 1980, pp. 1038-1046.
"Heat-Pipe Cooled—Package", Kertilian & Spaight, IBM Tech. Discl. Bull. vol. 18, No. 12, May 1976, pp. 3982.

Primary Examiner—G. P. Tolin
Attorney, Agent, or Firm—Sughrue, Mion, Zinn, Macpeak and Seas

[57] ABSTRACT

A container for electronic devices including heat generating elements comprises at least a first vertical wall portion formed therein with a closed conduit system and a heat exchange medium filling said closed conduit system, said heat exchange medium changing states from liquid to vapor by absorbing the heat generated by said elements, a lower end portion of said wall portion being adapted to be thermally connected to said elements.

4 Claims, 30 Drawing Figures

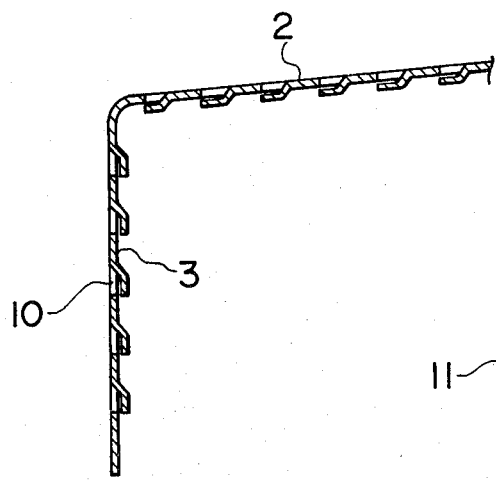
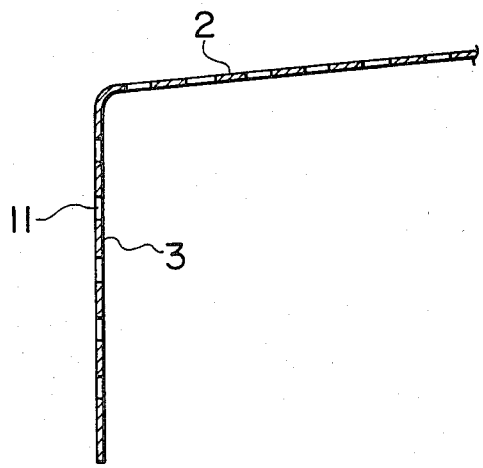
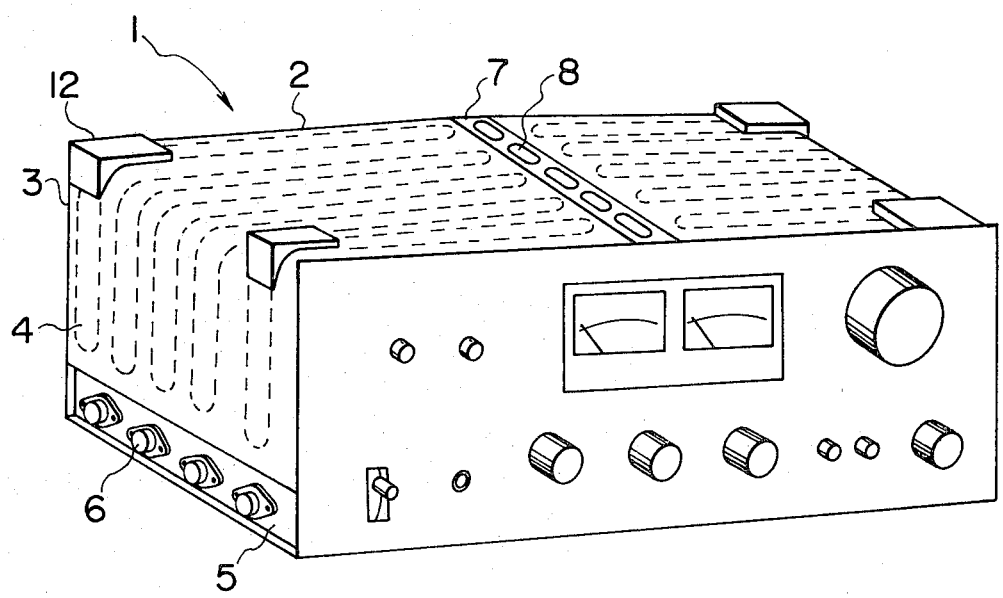

HEAT RADIATION SYSTEM FOR ELECTRONIC DEVICES

This is a continuation of application Ser. No. 97,110, filed Nov. 20, 1979, now abandoned.

BACKGROUND OF THE INVENTION

The present invention relates to a heat radiation system for electronic devices.

It has been known that a container for housing electronic circuit devices and/or elements is used to support these devices and elements therein as well as to seal the devices and elements housed therein from outside electric and magnetic fields, and is usually formed from a metal plate by press-shaping it. When heat generating devices such as power amplifiers are to be housed in such a container, it is necessary to discharge the heat generated therein. In order to perform the heat discharge from the power elements through the container to the atmosphere, it has been usual to previously prepare heat radiator blocks, each formed with a number of fins, and mount them on the container walls in such a way that these blocks are thermally communicated with the heat generating elements. In this case, however, the total surface area of the fins of the blocks must be large enough to obtain a desired heat radiation capability, causing the volume and weight of the heat radiator itself to be increased. When a sufficient surface area is provided, the fins become large necessarily causing an increase in the thermal resistance. Due to the latter, the heat radiation capability of the radiator does not increase proportionally to an increase of the size thereof and tends to be saturated. Therefore, in a case where a large amount of heat is to be discharged, there is required a very large radiator.

Another example of the conventional heat radiator is of the thermo-siphon type in which a volatile liquid is used as a heat exchange medium. The thermo-siphon type heat radiator also requires a number of fins to discharge the heat absorbed by the medium into the atmosphere.

In either of the conventional heat radiators, the space factor thereof in the container is very high causing the container to be balky and expensive.

SUMMARY OF THE INVENTION

An object of the present invention is to overcome the disadvantages inherent to the conventional heat radiator.

Another object of the present invention is to provide a heat radiator for electronic devices and elements, which has a high heat discharging performance.

A further object of the present invention is to provide a heat radiator which is effective in shielding the electronic devices against external electric and/or magnetic field.

BRIEF DESCRIPTION OF THE DRAWINGS

FIGS. 5a and 5b are cross sections of a part of the embodiment in FIG. 4;

FIGS. 6a and 6b are a perspective view and a front view of a fourth embodiment of the present invention;

DETAILED DESCRIPTION OF THE PREFERRED EMBODIMENTS

Figure 1:
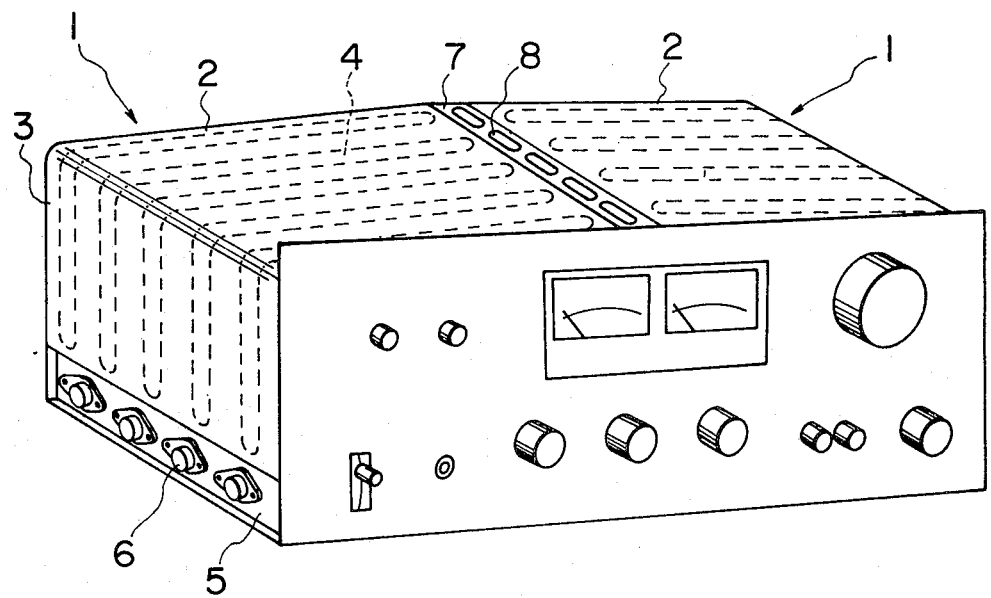
FIG. 1 is a perspective view of an embodiment of the present invention.
Figure 2:
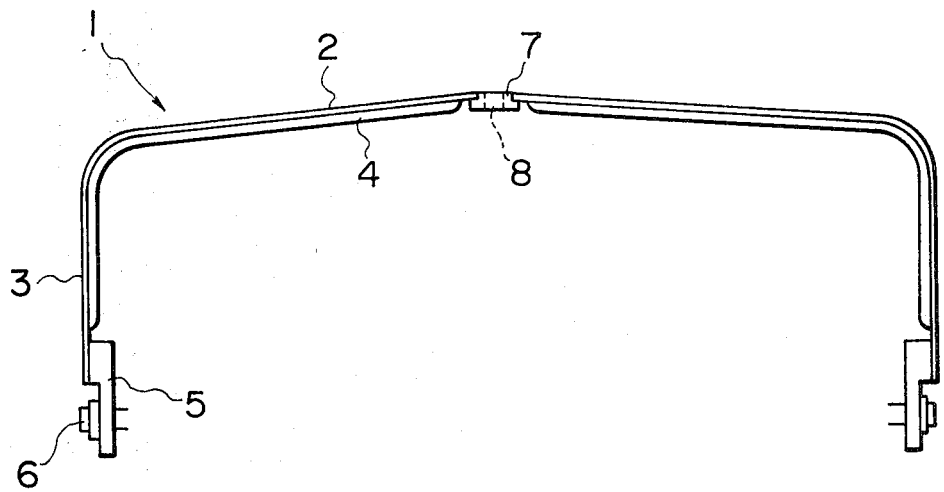
FIG. 2 is a front view of the embodiment in FIG. 1.

FIG. 1 is a perspective view of an embodiment of a container for electronic devices and elements according to the present invention, and FIG. 2 is a front view of a cover roof of the container in FIG. 1.

The container includes a front panel and a cover member which comprises a pair of cover halves 1 each formed by a metal plate etc. Each cover half includes a roof portion 2 and a side wall portion 3. In FIGS. 1 and 2, each of the cover halves 1 is formed suitably with a plurality of closed conduits 4 each extending vertically in parallel. A lower edge portion of the side wall 3 portion of the cover member 1 is fixedly supported by an outside surface of a heat block 5 of metal such as aluminum. Heat generating devices or elements such as power transistors 6 are mounted on the block 5. The pair of cover halves 1 having the same structure are joined together, along upper edge portions of the roof portions thereof with a support member 7 of a metal such as aluminum to form the ridge shaped roof of the container.

Each of the closed conduits, i.e., heat pipes 4, of the cover halves 1 is filled with a volatile liquid material such as Freon so that the latter can function as a heat exchange medium.

Heat generated by the power transistors 6 mounted on the heat blocks 5 is transmitted through the blocks 5 to the lower edge portions of the side wall portions 3. Since the lower ends of the heat pipes 4 are positioned adjacent the heat blocks, portions of the heat exchange medium existing around the lower ends of the heat pipes 4 absorb heat and the temperature thereof is raised. As a result, the liquid Freon vaporizes, absorbing a large amount of latent heat from portions thereof in liquid phase. The Freon vapor rapidly moves upwardly through the heat pipes 4 due to a pressure difference therein. Since the heat pipes 4 are cooled by the atmosphere through the cover halves 1, Freon vapor may be condensed on the inner walls of the heat pipes 4. In order to enhance the cooling effect of the atmosphere, the support member 7 is provided with a plurality of air passages 8.

Freon condensed on the inner walls of the heat pipes 4 drops therealong due to gravity. In order to facilitate the downward movement of the heat exchange medium in liquid phase, roof portions 2 of the cover halves 1 are inclined by a slight angle such as 5° to 10°. Alternatively, it may be possible to provide a wick in and along each closed conduit 4. In the latter case, the inclination of the roof portion 2 of the cover half 1 may be eliminated since the condensed medium may move downwardly with the wicks.

As above-mentioned, the container according to the present invention functions as not only the container for electronic devices and elements but also as a heat radiator. Therefore, there is no need for providing separate heat radiators. Since the heat resistance of the heat exchange medium used in the present invention is very small compared with conventional heat conduction through metal, i.e. in the order of one-several hundredth of that of metal through which heat has been discharged conventionally, and since the heat radiating area of the present container is very wide over the area of the wall portions, the cooling effect is much more increased.

Further, since the space factor of the cover member is very small comparing with the conventional heat radiator, it is possible to minimize the required size of the container and hence the overall container, resulting in a larger freedom in designing the apparatus structure and therefor in a reduction of manufacturing cost.

Figure 3:
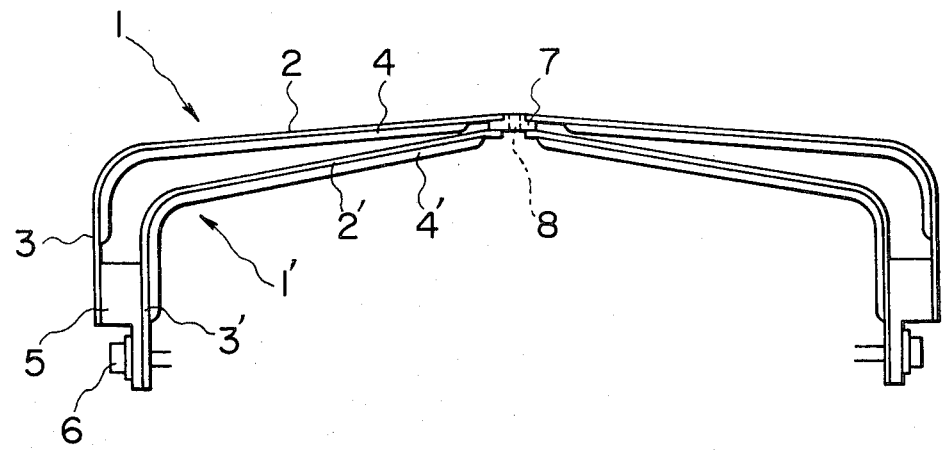
FIG. 3 is a front view of a second embodiment of the present invention.

FIG. 3 shows another embodiment of the present invention, in which another pair of cover halves 1' are further provided inside the cover halves 1 to form a double ridge roof structure. The cover halves 1' have substantially the same structure as those of the cover halves 1 except that the inclinations of the roof portions 2 of the cover halves 1' are made steeper than that of the cover halves 1. The lower edges of the side wall portions 3' of the cover halves 1'are supported by the inside surfaces of the heat blocks 5, and the upper edges of the roof portions 2' of the cover halves 1' are supported commonly by the support member 7. The angle of inclination of the roof portion 2' may be selected suitably. For example, it may be 10° when the inclination of the roof portion 2 is 5°.

With this double ridge roof structure, the capability of heat radiation of the container is much enhanced.

Figure 4:
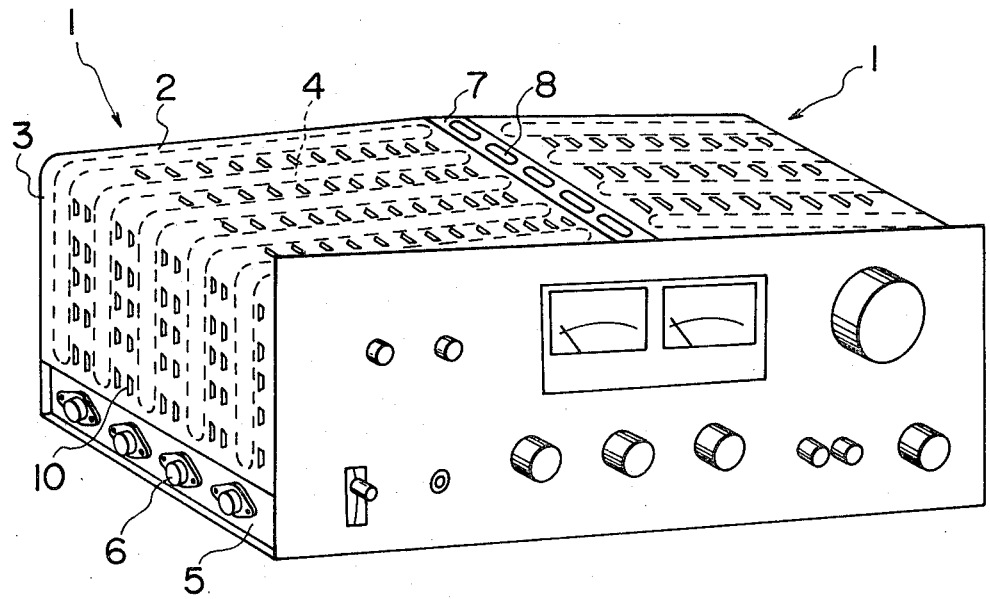
FIG. 4 is a perspective view of a third embodiment of the present invention.

FIG. 4 is a perspective view of another embodiment of the present invention. The embodiment in FIG. 4 has a plurality of slit-fins 10 on portions of the cover member 1 and/or 1' between the adjacent closed conduits 4 and/or 4' formed thereon. FIG. 5a shows a cross section of the wall portion formed with the slit-fins 10. With the provision of the slit-fins 10, the heat radiation area of the container is much increased together with the increased convection paths provided thereby. Instead of the fins, it is possible to punch out the wall portion to form a plurality of convection holes as shown in FIG. 5b, although the heat radiation area may be reduced.

Figure 6B:
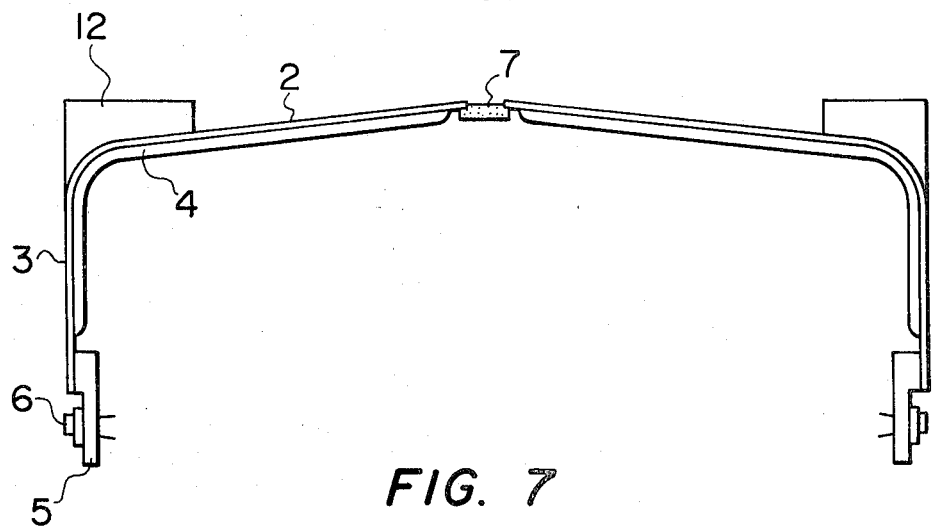

FIGS. 6a and 6b show another embodiment in perspective and in cross section, respectively, which is provided with pads 12 for compensating for the inclination of the roof portions 2. That is, when another container is to be put on the container in stack, the upper container will become unstable due to the inclination of the roof portion 2 of the lower container. In order to eliminate the above problem, the pads 12 are arranged suitably at corners of the roof portion 2, respectively. Each of the pads 12 is made of a thermally conductive material such as aluminum and has a flat upper surface and a curved lower surface contoured so that the latter fits on the curved and inclined portions of the cover half 1. It is preferable to detachably mount the pads 12 on the walls 1 so that, when there is no container to be stacked on, the pads can be removed.

Figure 7:
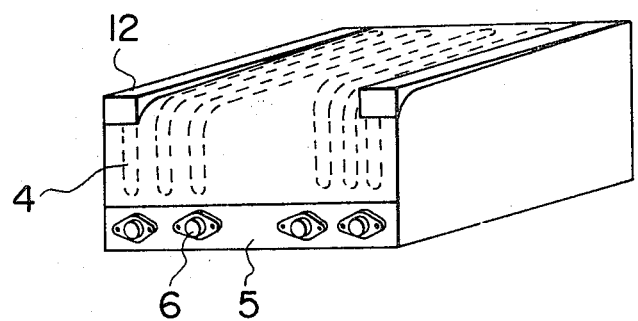
FIG. 7 is a perspective view of a modification of the embodiment in FIG. 6.

FIG. 7 shows a modification of the embodiment in FIG. 6, in which each of the pads 12 is extended throughout the full width of the roof portion. This embodiment may be useful when the upper container has no special legs at corners of a bottom portion thereof.

Figure 9:
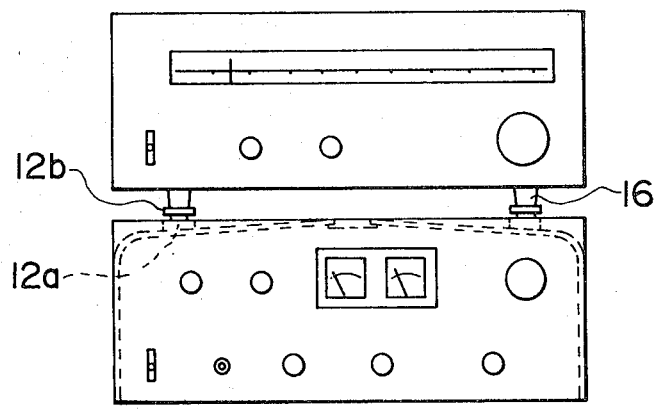
FIG. 9 is a schematic front view of the embodiment using the pads in FIG. 8.
Figure 8:
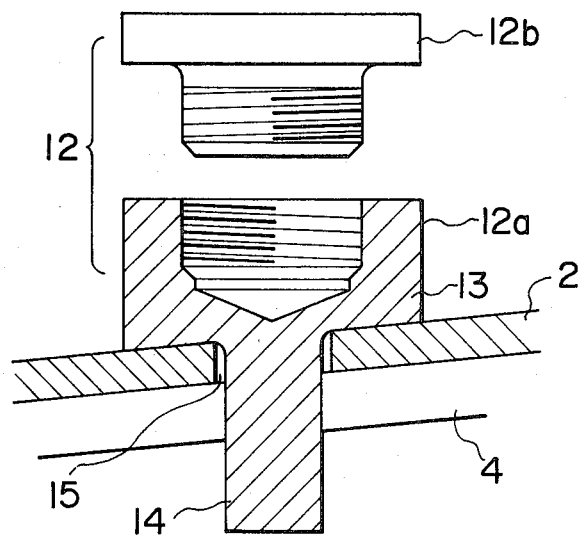
FIG. 8 is another example of the pad in FIG. 6.

FIG. 8 is a further modification of the pad 12 in FIG. 9, in which the pad is composed of a shouldered member 12a and a screw member 12b. The shouldered member 12a has an integral shank portion 14 extending downwardly from a lower surface of the member 12a. The diameter of the shank portion 14 is reduced with respect to a member 13 which has a female thread for receiving the screw member 12b. The lower surface of the member 13 is slanted.

The roof portion 2 is formed at least at the four corners thereof with convection holes 15 such as shown in FIG. 5b, and the reduced diameter shank 14 is inserted as shown in FIG. 8, with the slanted lower surfaces of the member 13 being fitted thereon.

With this pad, the height thereof can be regulated by turning the screw member 12b and, therefore, it becomes possible to regulate the position or attitude of the upper container as shown in FIG. 9 in which the upper container has legs 16 at four corners of a bottom plate which are put on the pads, respectively.

Figure 10:
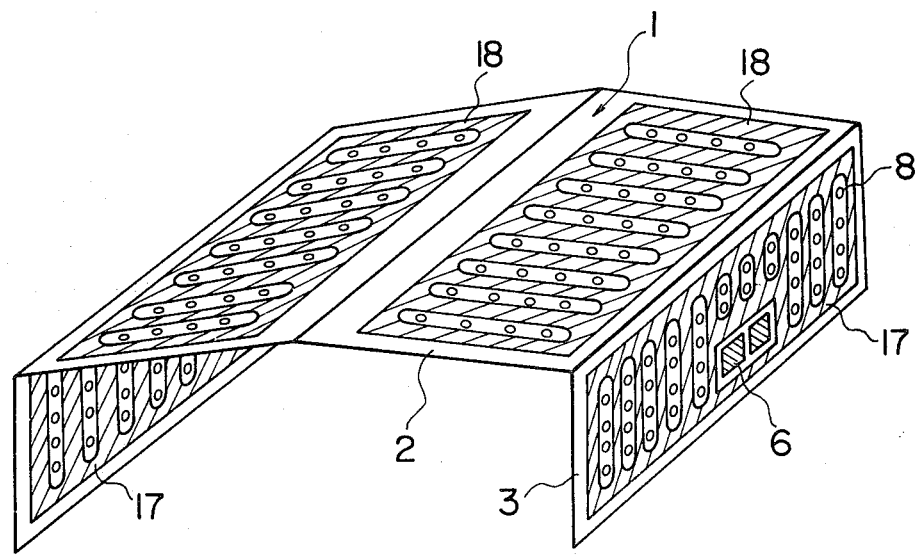
FIGS. 10 and 11 are a fifth and a sixth embodiment of the present invention, respectively.

FIG. 10 shows another embodiment of the present invention in which the closed conduits system 17 in the side wall portion 3 and the closed conduits system 18 in the roof portion 2 are formed independently from each other. Each of the system includes a plurality of vertical, closed conduits whose upper and lower end portions are connected together, respectively. In this embodiment the heat generating elements 6 are mounted directly on the side wall portion.

This structure can provide substantially the same effect as that of the closed conduit system including the closed conduits extending vertically throughout the roof and side wall portion when the distance between the lower end portion of the roof conduit system and the upper end portion of the side conduit system is made small. In this embodiment the upper ends of the roof portions 3 may be connected directly as shown.

Further, the heat generating elements may be mounted around the lower portion of the side wall portion directly as shown.

Figure 11:
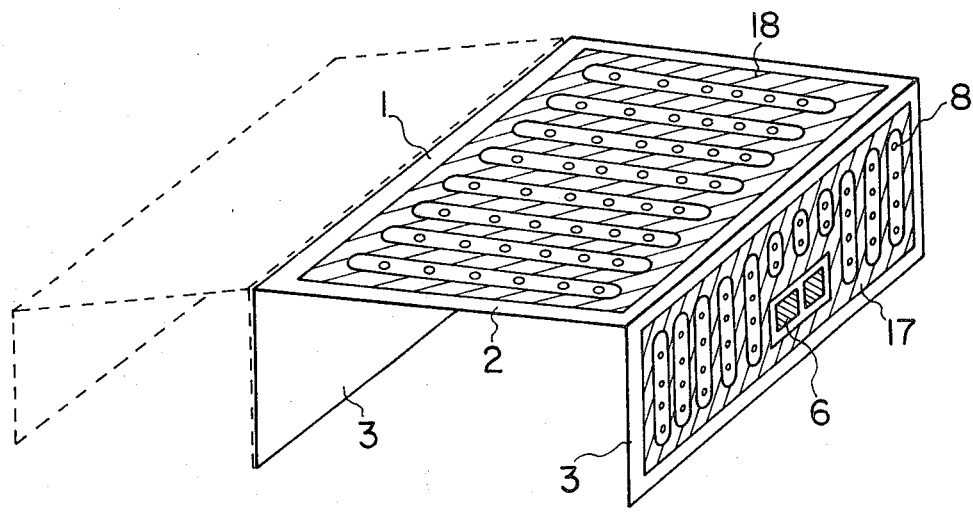

FIG. 11 is a modification of the structure in FIG. 10. In FIG. 11, one of the cover halves is made independent to form a Lean-to type roof structure. It is of course possible to use a pair of these structures to form a ridge shaped structure.

Figure 12:
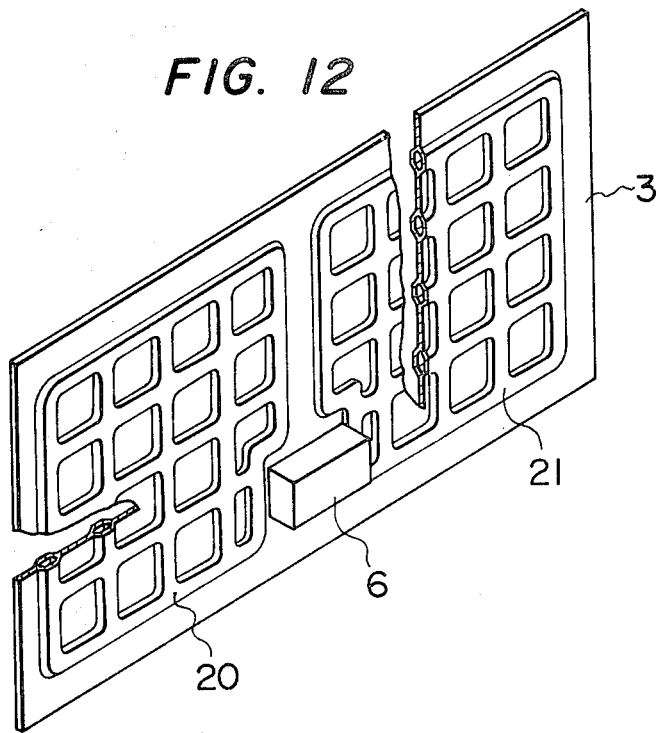
FIGS. 12 to 16 show various closed conduit systems each applicable to the side wall portion of any of the preceding embodiments, respectively.

FIG. 12 shows another example of the closed conduit system applicable to the side wall portion 3, which has a pair of gridiron layouts 20, 21 forming the paths for the heat exchange medium. The heat generating elements 6 are mounted on a lower central portion of the side wall portion 3 and between the gridiron conduit networks 20 and 21. In this embodiment, even if the side wall 3 is turned by 90° heat generated by the heat generating elements can be radiated by either one of the gridiron networks.

Figure 13:
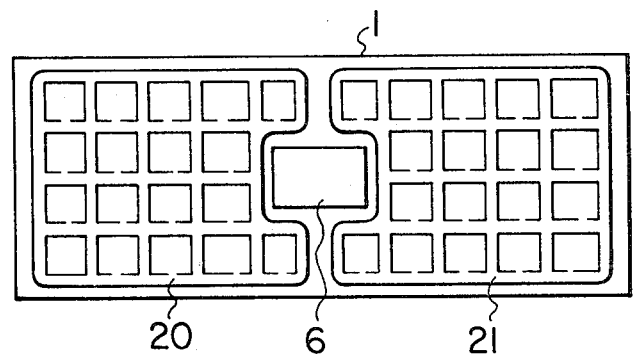
Figure 14:
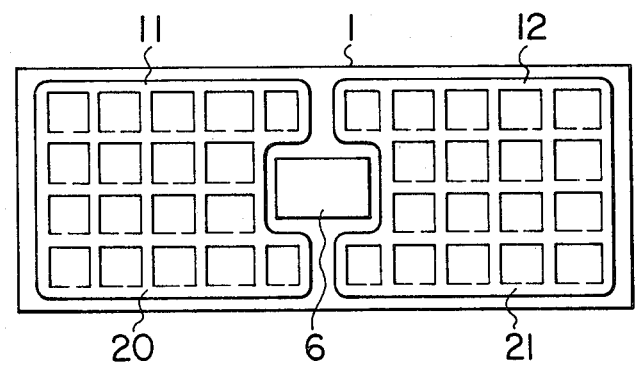
Figure 15:
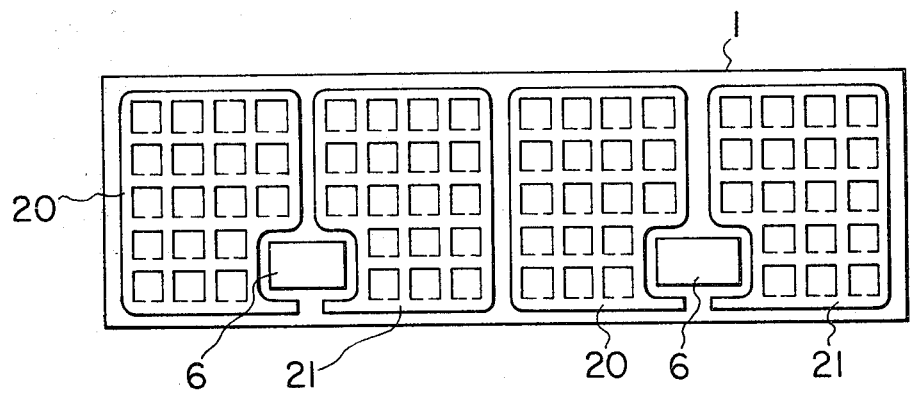
Figure 16:
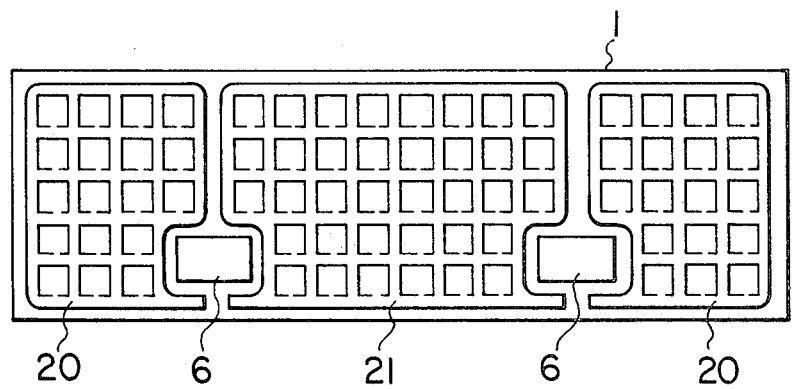

FIGS. 13 and 14 show other embodiments, respectively, in each of which the heat generating element 6 is mounted on a center portion of the side wall and between the gridiron networks. In each of these embodiments, it is advisable to make the amount of the heat exchange medium in each network 50% of the inner space of the latter. With this structure and with this amount of the medium, it is possible to turn the side wall by 90° or 180° with satisfactory heat radiation. FIGS. 15, 16 are modification of the embodiments in FIG. 12, in which the number of the heat generating elements is increased.

Figure 17:
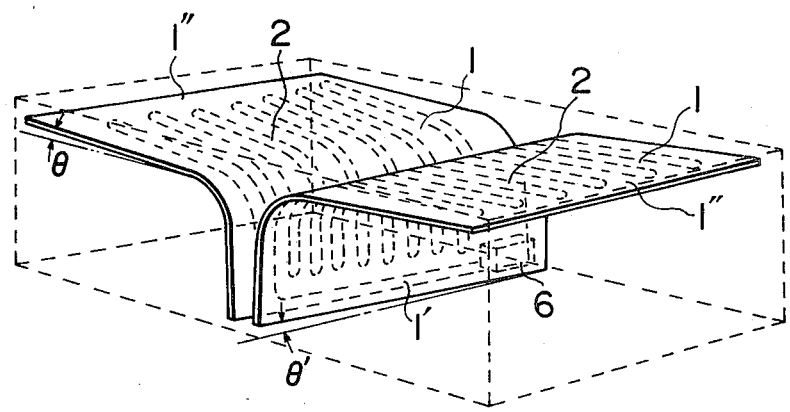
FIGS. 17 to 23 show other various embodiments of the present invention, respectively.

FIG. 17 shows another embodiment of the present invention in which the cover halves 1 are arranged back-to-back and the heat generating elements 6 are pinched between one side portion of the lower end portions of the side wall portions 3. The lower portion of the conduit system 4 is inclined so that the ore side portion at which the heat generating elements are mounted becomes lower than the other lower side portion of the conduit system.

Alternatively, it may be possible to incline the side wall portions 3 to obtain the sauce effect.

Figure 18A:
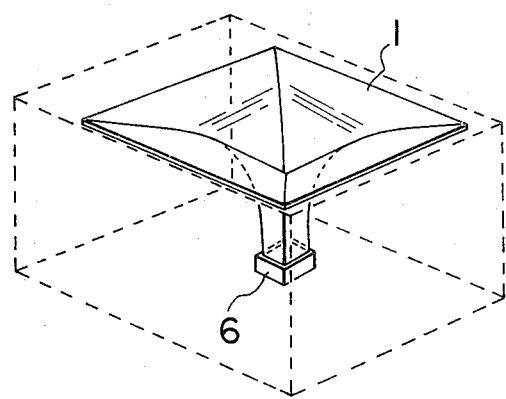
Figure 18B:
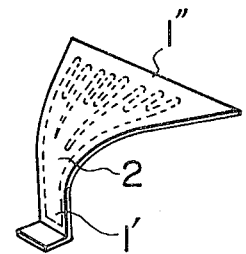

FIGS. 18a and 18b show a modification of the structure in FIG. 17, in which four cover members each having the closed conduit system are joined together to form a rectangular shaped structure. The heat generating element is mounted at the reduced end of the structure as shown.

Figure 19:
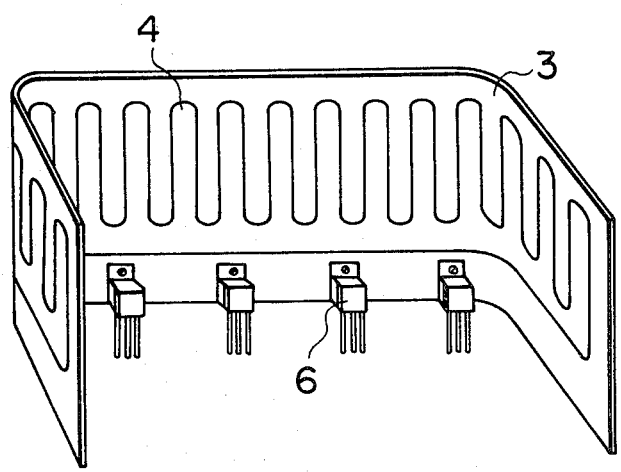
Figure 20:
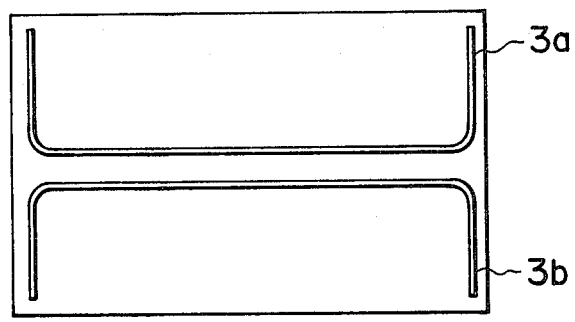
Figure 21:
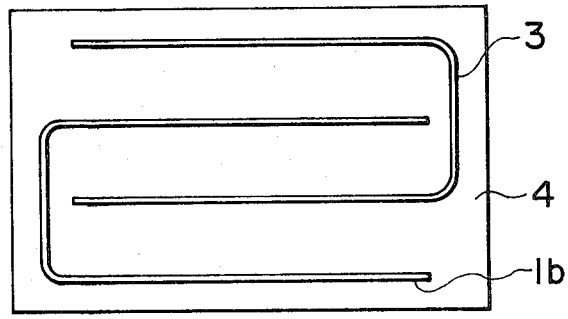

FIG. 19 is a further embodiment of the present invention, and FIGS. 20 and 21 are plan views of other embodiments, each of which is composed of a pair of structures shown in FIG. 19.

Figure 22:
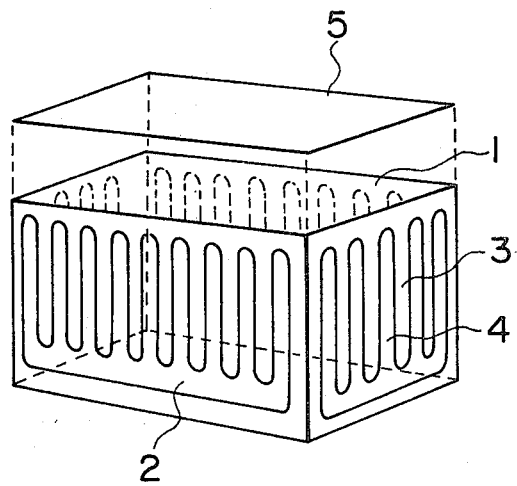
Figure 23:
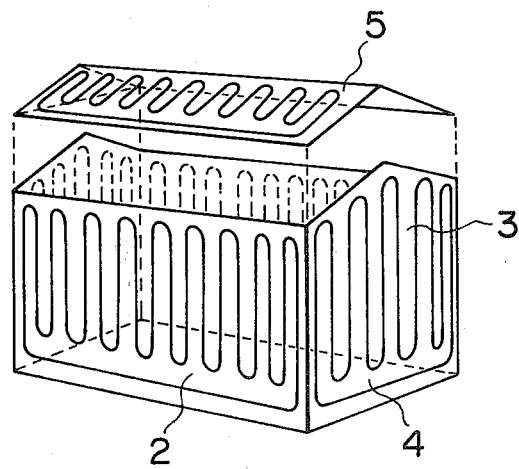

FIGS. 22 and 23 are further embodiments of the present invention. These embodiments may be suitably accomodated to electric devices including switching regulators.

FIGS. 24 to 27 show other embodiments, respectively, in each of which the closed conduit system 4 is formed in the heat receiving portion 5 which may have fins 24 serving as a conventional heat radiator.

Figure 24:
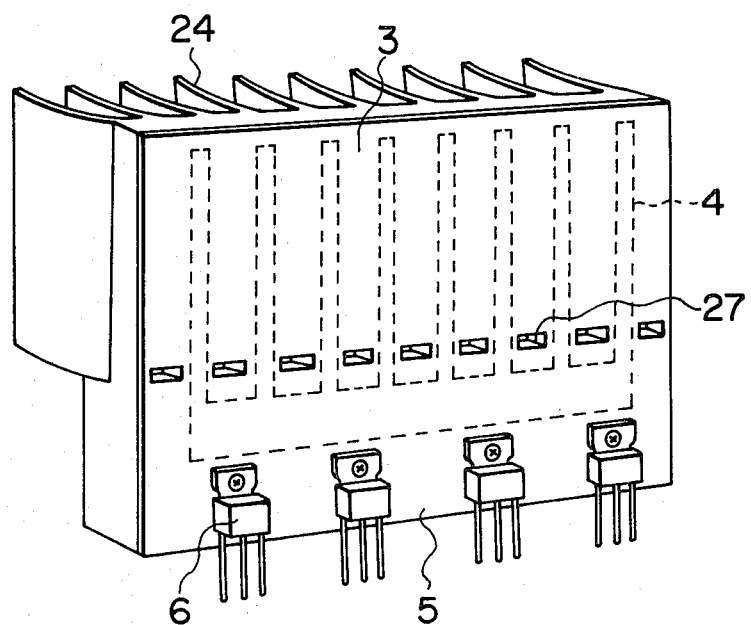
FIGS. 24 to 27 are still further embodiments of the present invention, respectively.

In FIG. 24, a plurality of through-holes 27 are provided around an intermediate portion between the heat radiating portion and the heat receiving portion 5. With these through-holes, the heat transmission through the intermediate portion is prevented, so that heat generated by the elements 6 is substantially absorbed by the heat exchanging medium in the conduit system 4.

Figure 25:
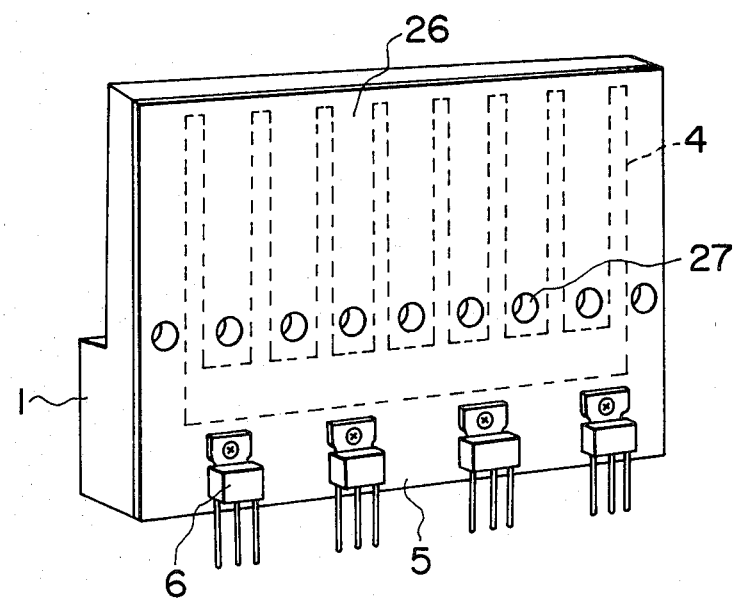
Figure 26:
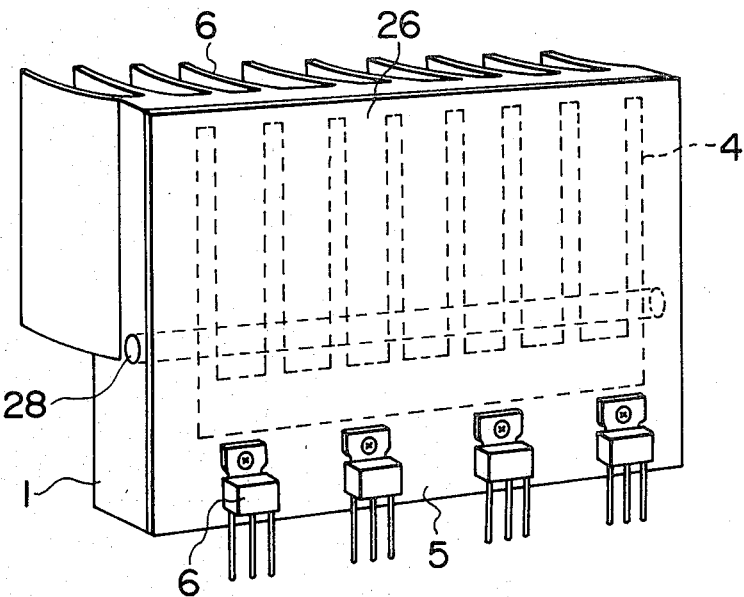
Figure 27:
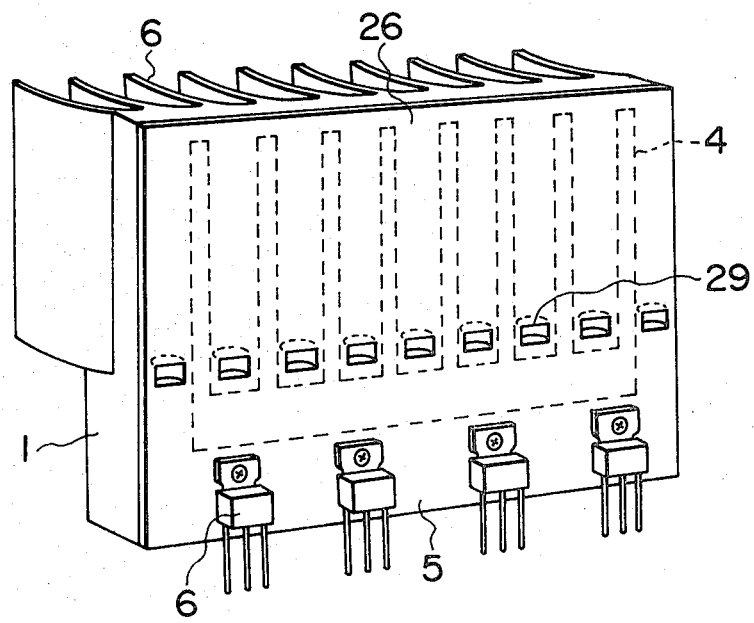

FIG. 25 shows a similar structure to that in FIG. 24, except that the through-hole is circular and there no fins are provided. FIG. 26 also shows a similar structure to that in FIG. 24, except that a single through-hole 28 extending along the heat receiving portion 5 is shown. In FIG. 27, recesses 29 are provided instead of the through-holes.

In the embodiments in FIGS. 24 to 27, the effect of the prevention of direct transmission of heat from the heat receiving portion 5 to the heat radiation portion 27 is satisfactory.

As described hereinbefore, according to the present invention, the problems concerning the radiation of heat generated by the heat generating elements such as power transistors of the electric device are solved. Further, in cases of the embodiments in FIGS. 1 to 11, 17, 23, a shielding effect against the external electric and/or magnetic field can be obtained.

Further as to the embodiment in each of FIGS. 24 to 27, although the heat radiator is shown as taking a block form, it is of course possible to apply it to the wall type heat radiator having the closed conduit system which may be provided by a roll-bond process of a pair of aluminum plates. This process can be applied to other embodiments disclosed hereinbefore. The fins may be provided by the skyve fin process wherein the tubes and fin of a heat exchanger are formed from a single body, the fins being skived up continuously from the heat exchanger body.

What is claimed is:

1. An enclosed container for electronic devices having heat generating elements therein, comprising:
    a structure enclosed by a plurality of external walls, said enclosed structure containing heat generating elements at least partially within an interior portion thereof, said enclosed structure having at least a first vertical external wall portion having a closed conduit system and a heat exchange medium filling said closed conduit system, said heat exchange medium changing states from liquid to vapor by absorbing heat generated by said elements, a lower end portion of said wall portion being thermally connected to said elements;
    an inclined first roof portion having one end portion connected to an upper end portion of said first vertical external wall portion, said roof portion being formed therein with a closed conduit system, a lower end portion of said closed conduit system of said roof portion being communicated with said closed conduit system of said first vertical external wall portion, whereby said first vertical external wall portion of said first roof portion forms a first Lean-to roof construction;
    a second Lean-to roof construction having the same structure as that of said first Lean-to roof construction, and a connecting member having a plurality of air passages for connecting the other ends of said first and second Lean-to roof constructions to form a ridge shaped roof structure.

2. A container for electronic devices claimed in claim 2, further comprising four pads arranged at four corners of said ridge shape roof, respectively, for providing a flat plane defined thereby.

3. A container for electronic devices claimed in claim 2, wherein said pad is regulatable in height.

4. A container for electronic devices claimed in claim 1, wherein said closed conduit system formed by roll-junction of a pair of aluminum plates.

* * * * *